(12) United States Patent
Kawai et al.

(10) Patent No.: US 9,853,040 B2
(45) Date of Patent: Dec. 26, 2017

(54) SEMICONDUCTOR MEMORY DEVICE

(71) Applicant: Toshiba Memory Corporation, Minato-ku (JP)

(72) Inventors: Tomoya Kawai, Kawasaki (JP); Tsutomu Tezuka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/271,379

(22) Filed: Sep. 21, 2016

(65) Prior Publication Data
US 2017/0278852 A1 Sep. 28, 2017

(30) Foreign Application Priority Data

Mar. 22, 2016 (JP) .................................. 2016-057113

(51) Int. Cl.
*H01L 29/72* (2006.01)
*H01L 29/788* (2006.01)
*H01L 27/115* (2017.01)
*H01L 21/28* (2006.01)
*H01L 27/1157* (2017.01)
(Continued)

(52) U.S. Cl.
CPC .......... *H01L 27/1157* (2013.01); *G11C 16/08* (2013.01); *G11C 16/24* (2013.01); *G11C 16/26* (2013.01); *H01L 27/11565* (2013.01)

(58) Field of Classification Search
CPC .......... H01L 27/1157; H01L 27/11565; G11C 16/08; G11C 16/24; G11C 26/26
USPC ....... 257/324, 321, 319, 315, 314, 302, 208, 257/E27.026, E29.262, E29.309; 438/264, 268, 591
See application file for complete search history.

(56) References Cited

U.S. PATENT DOCUMENTS 8,617,970 B2 12/2013 Koto
8,796,757 B2 8/2014 Kai et al.
(Continued)

FOREIGN PATENT DOCUMENTS

JP 2011-187901 9/2011
JP 2012-004249 1/2012
JP 2013-543266 11/2013

OTHER PUBLICATIONS

Volker Schmidt et al., "Silicon Nanowires: A Review on Aspects of Their Growth and Their Electrical Properites," *Advanced Materials* 21, 25-26 (2009): 2681-2702.

*Primary Examiner* — Dao H Nguyen
(74) *Attorney, Agent, or Firm* — Oblon, McClelland, Maier & Neustadt, L.L.P.

(57) ABSTRACT

A semiconductor memory device according to an embodiment includes: a semiconductor substrate; a plurality of first insulating layers and first conductive layers stacked alternately in a first direction above the semiconductor substrate; a first semiconductor layer extending in the first direction; and a memory layer disposed between one of the first insulating layers and the first semiconductor layer and between one of the first conductive layers and the first semiconductor layer, the memory layer including a charge accumulation layer, the first semiconductor layer and the memory layer having a gap, between one of the first insulating layers and the first semiconductor layer, and the first semiconductor layer and the memory layer being contacted each other, between one of the first conductive layers and the first semiconductor layer.

20 Claims, 13 Drawing Sheets

(51) Int. Cl.
*H01L 27/11565* (2017.01)
*G11C 16/08* (2006.01)
*G11C 16/24* (2006.01)
*G11C 16/26* (2006.01)

(56) References Cited

U.S. PATENT DOCUMENTS

| | | | |
|---|---|---|---|
| 8,952,443 B2 * | 2/2015 | Chang | H01L 21/28273 |
| | | | 257/208 |
| 9,455,261 B1 * | 9/2016 | Sun | H01L 27/115 |
| 2011/0303969 A1 | 12/2011 | Kai et al. | |
| 2012/0112264 A1 * | 5/2012 | Lee | H01L 27/11551 |
| | | | 257/324 |
| 2012/0329253 A1 | 12/2012 | Koto | |
| 2013/0134492 A1 * | 5/2013 | Yang | H01L 27/11582 |
| | | | 257/314 |
| 2013/0161725 A1 | 6/2013 | Park et al. | |
| 2013/0341701 A1 | 12/2013 | Blomme et al. | |
| 2017/0018571 A1 * | 1/2017 | Alsmeier | H01L 27/11551 |

* cited by examiner

SEMICONDUCTOR MEMORY DEVICE

CROSS-REFERENCE TO RELATED APPLICATIONS

This application is based upon and claims the benefit of priority from the prior Japanese Patent Application No. 2016-057113, filed on Mar. 22, 2016, the entire contents of which are incorporated herein by reference.

BACKGROUND

Field

An embodiment of the present invention relates to a semiconductor memory device.

Description of the Related Art

In the field of semiconductor memory devices, a three-dimensional type NAND type flash memory has been gathering attention as a device capable of achieving a high degree of integration, without being confined to a limit of resolution of lithography technology. This three-dimensional type NAND type flash memory comprises a stacked body in which a plurality of conductive layers functioning as a word line or select gate line and inter-layer insulating layers are stacked alternately above a semiconductor substrate, and comprises a columnar semiconductor layer disposed so as to penetrate this stacked body. This semiconductor layer functions as a channel of a memory cell. In addition, the three-dimensional type NAND flash memory comprises a block layer, a charge accumulation layer, and a tunnel insulating layer disposed sequentially between the conductive layer and the semiconductor layer in the stacked body.

Even in the three-dimensional type NAND type flash memory having the above-described structure, read disturbance in a fringe electric field or charge leakage from the charge accumulation layer due to effects of miniaturization, are a problem, similarly to in other semiconductor devices.

DETAILED DESCRIPTION

A semiconductor memory device according to an embodiment includes: a semiconductor substrate; a plurality of first insulating layers and first conductive layers stacked alternately in a first direction above the semiconductor substrate; a first semiconductor layer extending in the first direction; and a memory layer disposed between one of the first insulating layers and the first semiconductor layer and between one of the first conductive layers and the first semiconductor layer, the memory layer including a charge accumulation layer, the first semiconductor layer and the memory layer having a gap, between one of the first insulating layers and the first semiconductor layer, and the first semiconductor layer and the memory layer being contacted each other, between one of the first conductive layers and the first semiconductor layer.

A semiconductor memory device according to an embodiment will be described below with reference to the drawings.

First, an overall configuration of the semiconductor memory device according to the embodiment will be described.

Figure 1:
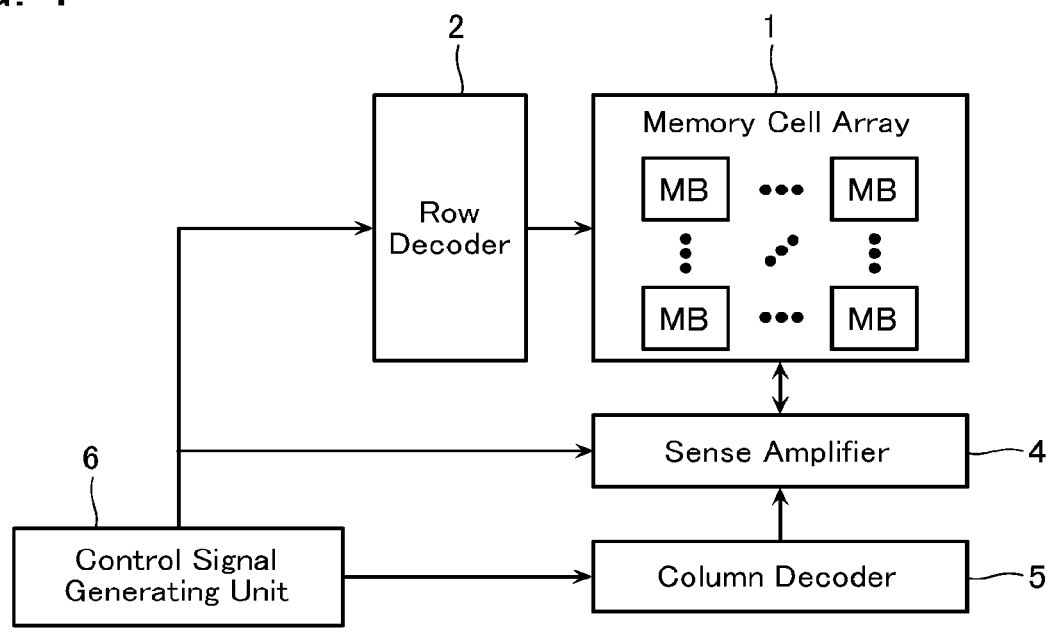
FIG. 1 is a view showing functional blocks of a semiconductor memory device according to an embodiment.

FIG. 1 is a view showing functional blocks of the semiconductor memory device according to the embodiment.

The semiconductor memory device according to the embodiment comprises: a memory cell array 1; a row decoder 2; a sense amplifier 4; a column decoder 5; and a control signal generating unit 6. The memory cell array 1 includes a plurality of memory blocks MB. Each memory block MB includes a plurality of memory cells (not shown in FIG. 1) arranged three-dimensionally therein. The row decoder 2 decodes a downloaded block address signal, and so on, and controls a write operation and a read operation of data to the memory cell. The sense amplifier 4 detects and amplifies an electrical signal flowing in the memory cell during the read operation. The column decoder 5 decodes a column address signal and controls the sense amplifier 4. The control signal generating unit 6 boosts a reference voltage and generates a high voltage employed in the write operation or an erase operation, and moreover, generates a control signal and controls the row decoder 2, the sense amplifier 4, and the column decoder 5.

Next, an equivalent circuit of the memory cell array 1 will be described.

Figure 2:
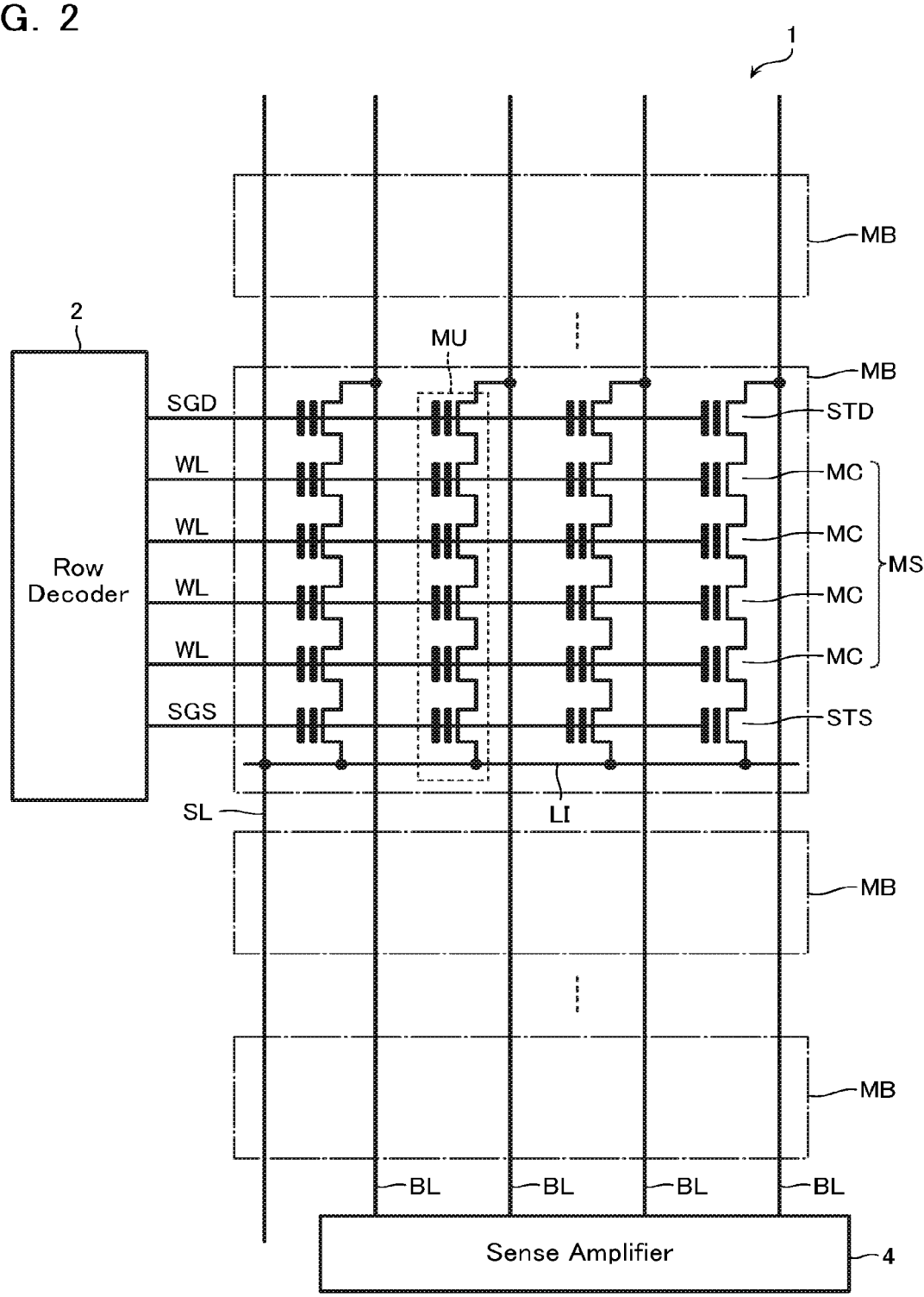
FIG. 2 is an equivalent circuit diagram of a memory cell array of the semiconductor memory device according to the embodiment.

FIG. 2 is an equivalent circuit diagram of the memory cell array of the semiconductor memory device according to the embodiment.

As previously mentioned, the memory cell array 1 includes the plurality of memory blocks MB. This memory block MB is a unit of the erase operation. Each memory block MB includes: a source line SL; a plurality of bit lines BL that are electrically connected to the sense amplifier 4; a source side select gate line SGS, a plurality of word lines WL, and a drain side select gate line SGD that are electrically connected to the row decoder 2; and a source contact LI electrically connected to the source line SL. Of these, the source line SL and the plurality of bit lines BL are shared by the plurality of memory blocks MB.

In addition, each memory block MB includes a plurality of memory units MU each having its one end connected to the bit line BL and having its other end connected to the source contact LI. Each memory unit MU includes: a memory string MS; a source side select transistor STS connected between the memory string MS and the source contact LI; and a drain side select transistor STD connected between the memory string MS and the bit line BL. The plurality of memory strings MS each include a plurality of memory cells MC connected in series. Each memory cell MC is a transistor having a semiconductor layer, a charge accumulation layer, and a control gate, and stores a plurality of data by a charge amount accumulated in the charge accumulation layer. The plurality of word lines WL are commonly connected to the control gates of pluralities of the memory cells MC of different memory strings MS. The plurality of memory cells MC commonly connected to one word line WL are a unit of the write operation and the read operation, called a page. The source side select gate line SGS is connected to a control gate of the source side select transistor STS. The drain side select gate line SGD is connected to a control gate of the drain side select transistor STD.

Next, a structure of the memory cell array 1 will be described.

Figure 3:
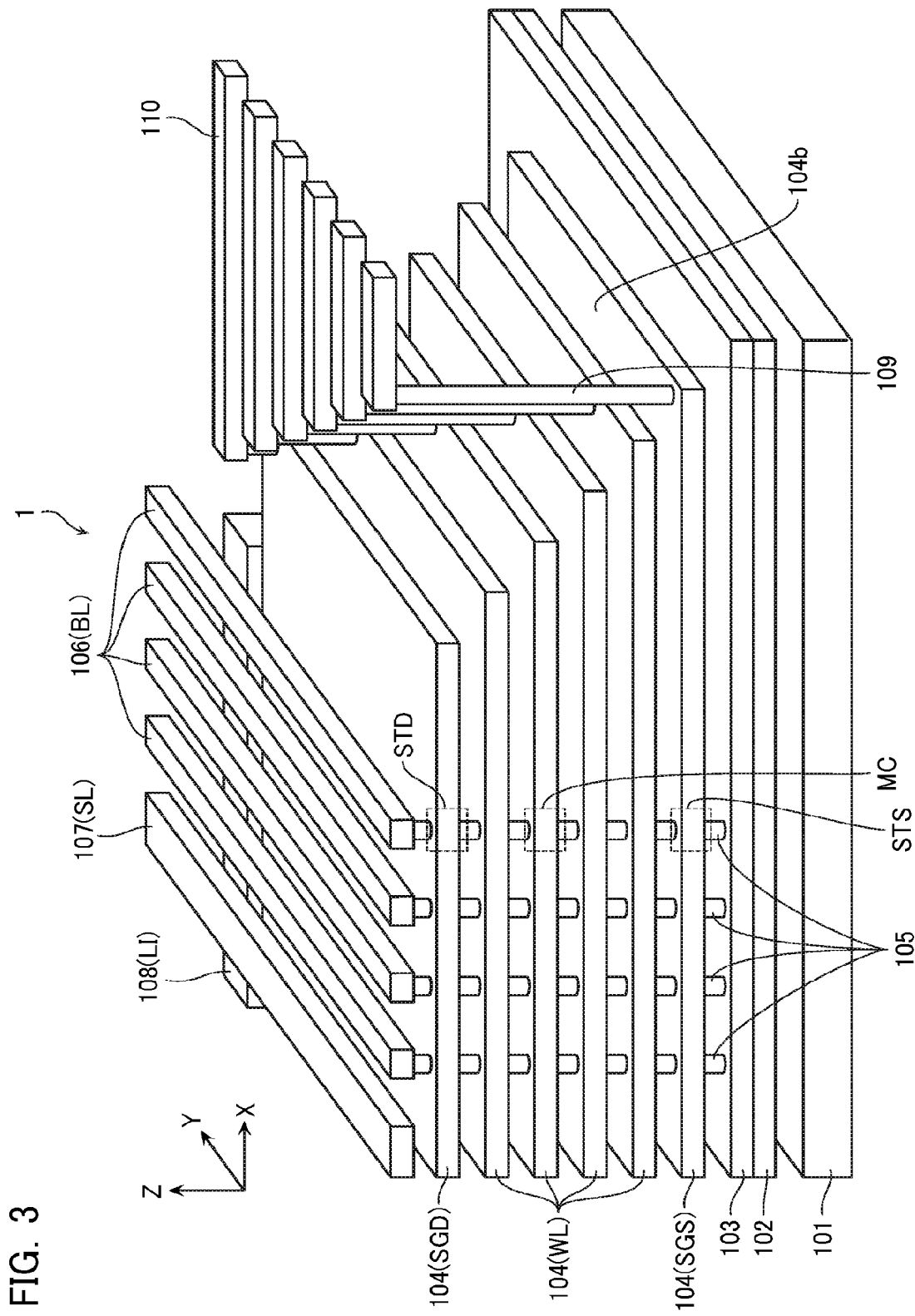
FIG. 3 is a perspective view showing a structure of the memory cell array of the semiconductor memory device according to the embodiment.
Figure 4:
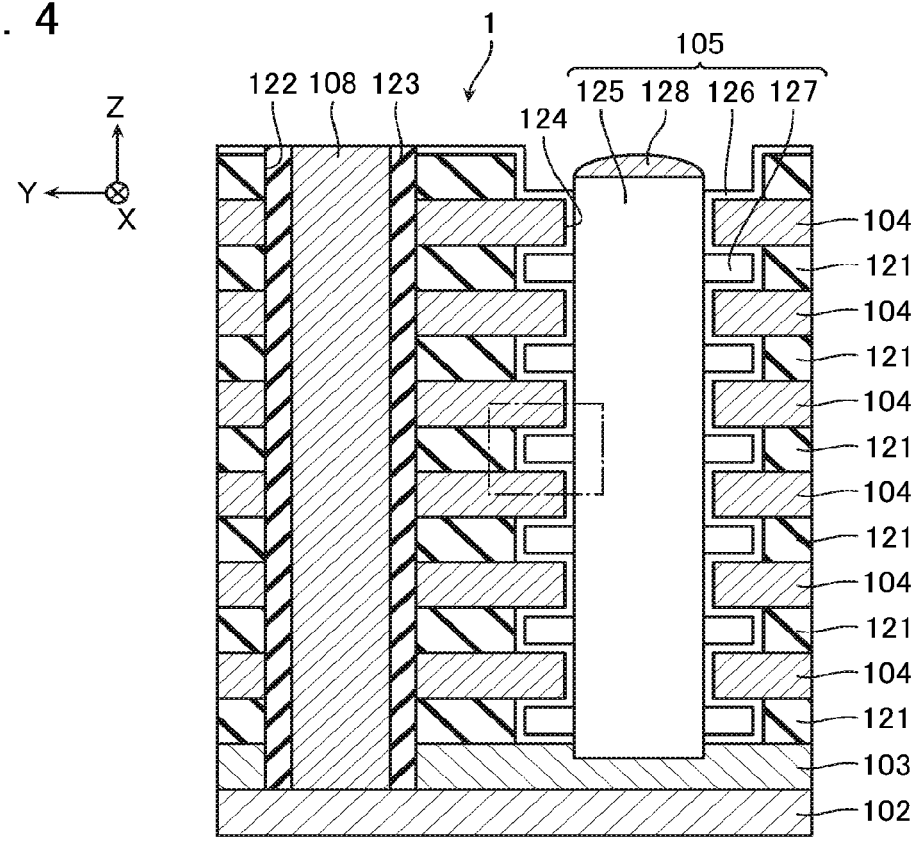
FIG. 4 is a cross-sectional view of the memory cell array of the semiconductor memory device according to the embodiment.
Figure 5:
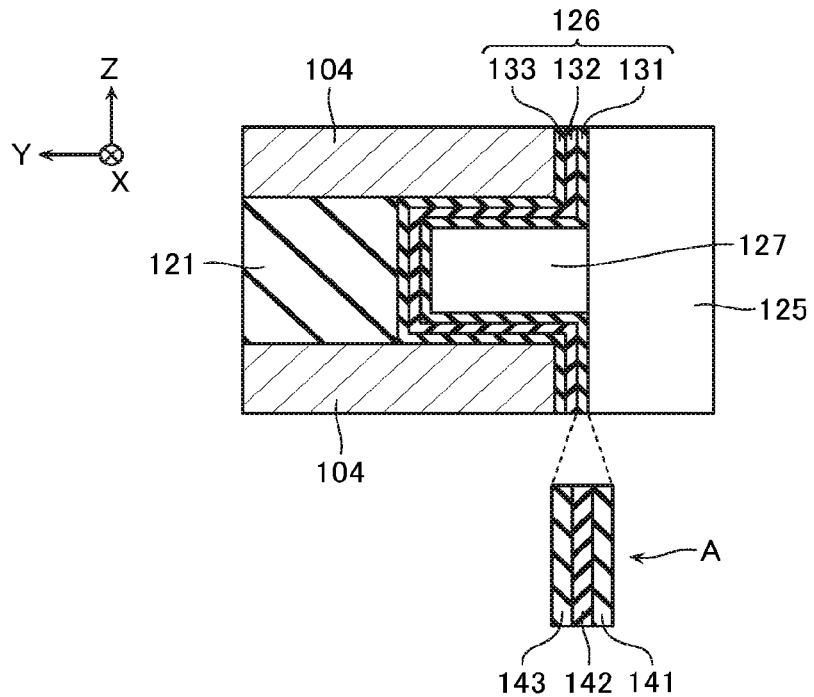
FIG. 5 is an enlarged view of a range shown by the dot-chain line of FIG. 4.

FIG. 3 is a perspective view showing the structure of the memory cell array of the semiconductor memory device according to the embodiment. In addition, FIG. 4 is a cross-sectional view in Y-Z directions of the memory cell array of the semiconductor memory device according to the embodiment, and FIG. 5 is an enlarged view of a range shown by the dot-chain line of FIG. 4.

The memory cell array 1 includes: a semiconductor substrate 101; and a conductive layer 102 and metal layer 103 that are stacked in the Z direction above the semiconductor substrate 101. Now, the semiconductor substrate 101 is configured by silicon (Si), for example. The conductive layer 102 is configured by tungsten (W), for example. The metal layer 103 is a layer required in the case of employing a Vapor-Liquid-Solid thin film formation method (hereafter, referred to as "VLS method") in a manufacturing step of the device, as will be described later, and is formed by a metal that acts as a catalyst of VLS growth. Examples of this metal include aluminum (Al), tin (Sn), and gold (Au).

In addition, the memory cell array 1 includes: a plurality of conductive layers 104 stacked above the metal layer 103; and a plurality of memory columnar bodies 105 that are disposed in a hole 124, penetrate this conductive layer 104, and extend in the Z direction. An inter-layer insulating layer 121 is disposed between each of the plurality of conductive layers 104. Now, each conductive layer 104 is formed by tungsten (W), for example. The plurality of conductive layers 104 function as the source side select gate line SGS, the plurality of word lines WL, and the drain side select gate line SGD. Intersections of the plurality of conductive layers 104 and memory columnar bodies 105 function as the source side select transistor STS, the plurality of memory cells MC, and the drain side select transistor STD. The inter-layer insulating layer 121 is formed by silicon oxide ($SiO_2$), for example. Note that a structure of the memory columnar body 105 will be described later.

The plurality of conductive layers 104 have their ends formed in a stepped shape. That is, a certain conductive layer 104 has a contact part 104b that does not face a bottom surface of another conductive layer 104 positioned in a layer above. The conductive layer 104 is connected to a via 109 at this contact part 104b. The via 109 is connected at its upper end to a wiring line 110. The via 109 and the wiring line 110 are formed by tungsten (W), for example.

In addition, the memory cell array 1 includes a conductive layer 108 that is disposed in a trench 122, faces side surfaces in the Y direction of the plurality of conductive layers 104, and extends in an X direction. The conductive layer 108 is connected at its bottom surface to the conductive layer 102. An insulating layer 122 is disposed between side surfaces facing the Y direction of the conductive layer 102, the conductive layer 104, and the inter-layer insulating layer 121, and a side surface facing the Y direction of the conductive layer 108. Now, the conductive layer 108 is formed from tungsten (W), for example, and functions as the source contact LI. The insulating layer 122 is formed by silicon oxide ($SiO_2$), for example.

In addition, the memory cell array 1 includes a plurality of conductive lines 106 and a conductive line 107 that are arranged with a certain pitch in the X direction and extend in the Y direction above the plurality of conductive layers 104 and memory columnar bodies 105. The conductive line 106 is electrically connected at its bottom surface to the memory columnar body 105. The conductive line 106 is formed by copper (Cu), for example, and functions as the bit line BL. The conductive line 107 is electrically connected at its bottom surface to the conductive layer 108. The conductive line 107 is formed by copper (Cu), for example, and functions as the source line SL. Note that the source line SL of the embodiment is not limited to the case of being disposed above the plurality of conductive layers 104 and memory columnar bodies 105 like the conductive line 107. For example, a conductive layer acting as the source line SL may be disposed between the semiconductor substrate 101 and the lowermost layer conductive layer 104 (source side select gate line SGS), in place of the conductive line 107.

Next, a structure of the memory columnar body 105 and its periphery will be described in detail.

The memory columnar body 105 includes: a semiconductor layer 125; and a memory layer 126. The semiconductor layer 125 is a columnar body that penetrates the plurality of conductive layers 104 and the plurality of inter-layer insulating layers 121 in the Z direction. The semiconductor layer 125 contacts the metal layer 103 at a bottom surface of the semiconductor layer 125. As will be described later, the semiconductor layer 125 may be formed by the VLS method. In this case, the semiconductor layer 125 is formed by polysilicon (Poly-Si) having a crystal whose average grain size is larger than its average thickness in the Y direction, or by monocrystalline silicon (Mono-Si), for example. Moreover, in the case of forming by the VLS method, a VLS catalyst 128 is left in an upper part of the semiconductor layer 125. The VLS catalyst 128 is formed by aluminum (Al) into which silicon (Si) has dissolved as a solid, for example.

The memory layer 126 is disposed between the semiconductor layer 125 and the conductive layer 104. The memory layer 126 includes a tunnel layer 131, a charge accumulation layer 132, and a block layer 133 that are disposed from the semiconductor layer 125 to the conductive layer 104. Now, the tunnel layer 131 is formed by silicon oxide ($SiO_2$), for example. Note that, as shown in A in FIG. 5, the tunnel layer 131 may, for example, have a multi-layer structure of an oxide layer 141 adopting silicon oxide ($SiO_2$) as its material, a nitride layer 142 adopting silicon nitride (SiN) as its material, and an oxide layer 143 adopting silicon oxide ($SiO_2$) as its material. The charge accumulation layer 132 is formed by a material capable of charge accumulation, for example, silicon nitride (SiN). The block layer 133 is formed by silicon oxide ($SiO_2$), for example.

In the case of the present embodiment, the memory cell array 1 has a structure in which a width in the Y direction of the inter-layer insulating layer 121 is narrower than a width in the Y direction of the conductive layer 104, and, when viewed from the inside of the hole 124, a side surface facing the Y direction of the inter-layer insulating layer 121 is recessed with respect to a side surface facing the Y direction of the conductive layer 104.

Furthermore, the memory layer 126 is formed continuously between the memory cells MC adjacent in the Z direction, so as to follow the inside of the hole 124. In other words, the memory layer 126 contacts a side surface and upper surface of a certain conductive layer 104 exposed in the hole 124, a side surface of a certain inter-layer insulating layer 121 disposed on this certain conductive layer 104, and a bottom surface and side surface of another certain conductive layer 104 disposed on this certain inter-layer insulating layer 121. Moreover, in the same layer as the conductive layer 104, the memory layer 126 contacts the semiconductor layer 125, whereas in the same layer as the inter-layer insulating layer 121 having a side surface more recessed in the Y direction than that of the conductive layer 104 is, the memory layer 126 does not contact the semiconductor layer 125 and a gap 127 is provided between the semiconductor layer 125 and the memory layer 126.

Next, manufacturing steps of the memory cell array 1 will be described.

FIGS. 6 to 20 are cross-sectional views in the Y-Z directions showing a method of manufacturing the memory cell array of the semiconductor memory device according to the embodiment.

Figure 6:
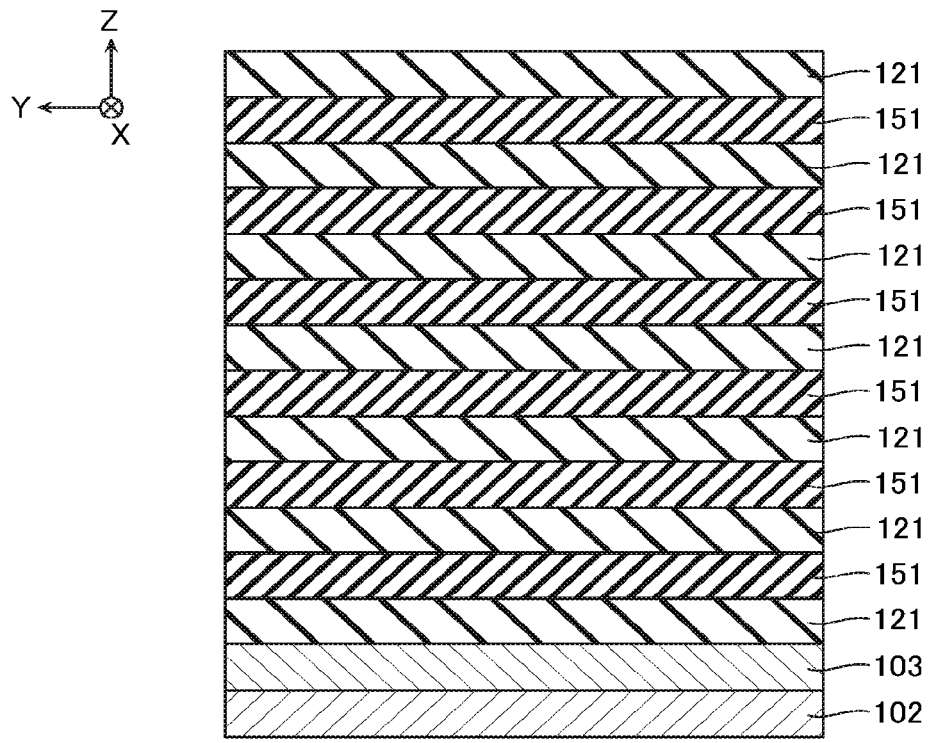
FIGS. 6 to 20 are cross-sectional views showing a method of manufacturing the memory cell array of the semiconductor memory device according to the embodiment.

First, the conductive layer 102 and the metal layer 103 are stacked in the Z direction on the unshown semiconductor substrate 101. Now, the conductive layer 102 is formed by tungsten (W), for example. The metal layer 103 is formed by, for example, aluminum (Al), tin (Sn), or gold (Au). Next, as shown in FIG. 6, a plurality of the inter-layer insulating layers 121 and sacrifice layers 151 are stacked alternately in the Z direction above the metal layer 103. Now, the inter-layer insulating layer 121 is formed by silicon oxide ($SiO_2$), for example. The sacrifice layer 151 is formed by silicon nitride (SiN), for example. This sacrifice layer 151 is replaced, in a later step, by the conductive layer 104 acting as the word line WL, and so on.

Figure 7:
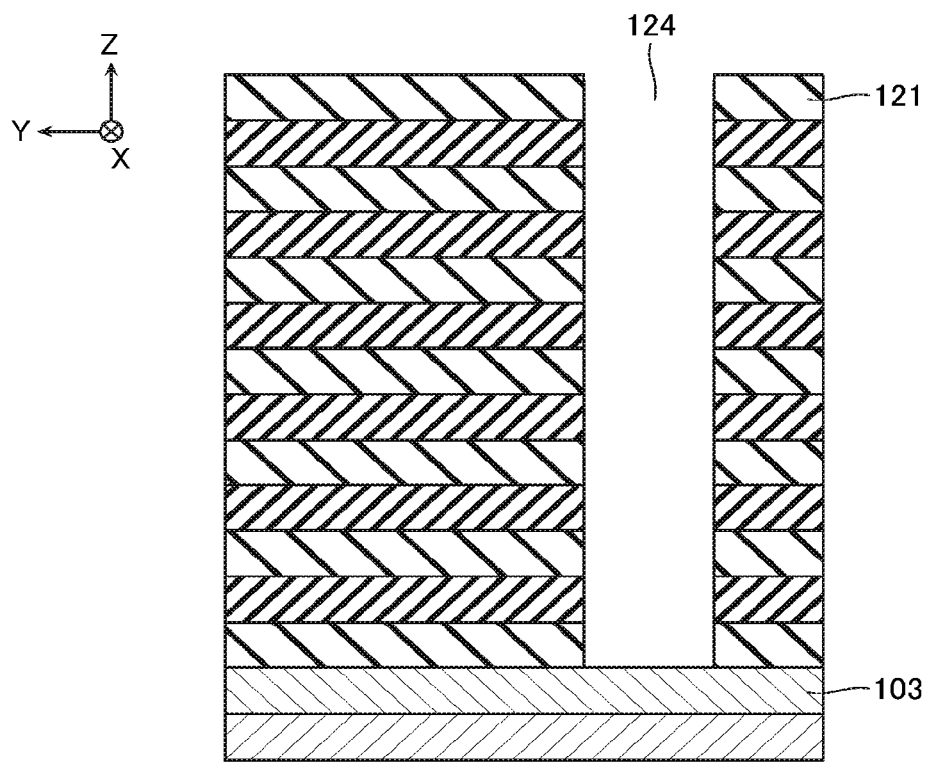

Next, as shown in FIG. 7, the hole 124 extending in the Z direction is formed from an upper surface of the uppermost layer inter-layer insulating layer 121 to an upper surface of the metal layer 103, by anisotropic etching.

Figure 8:
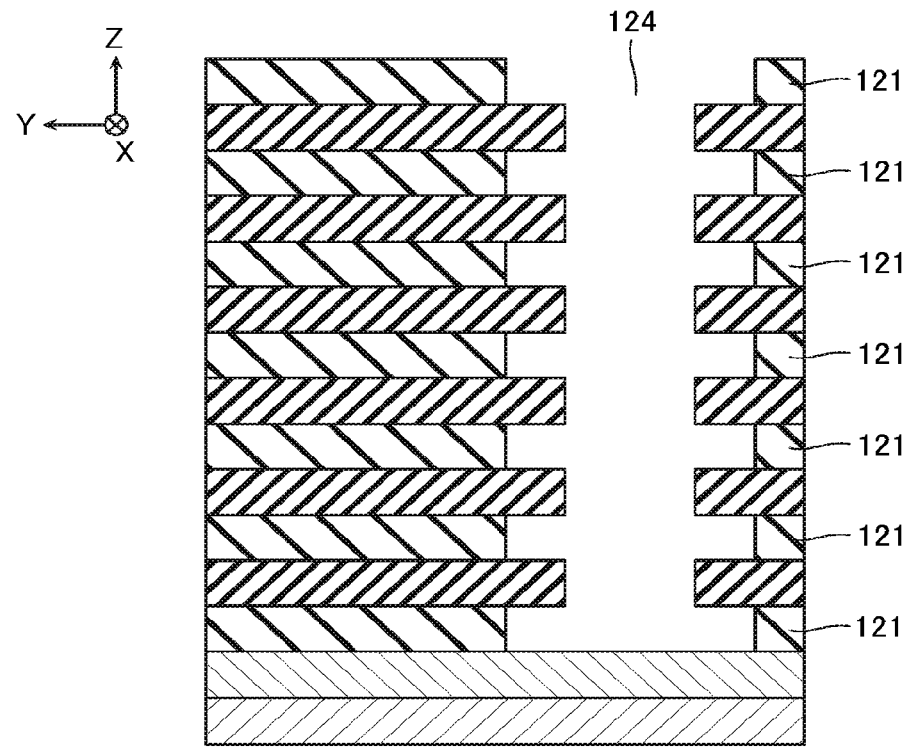

Next, as shown in FIG. 8, an end of the inter-layer insulating layer 121 exposed on a side surface of the hole 124 is selectively recessed by isotropic wet etching.

Figure 9:
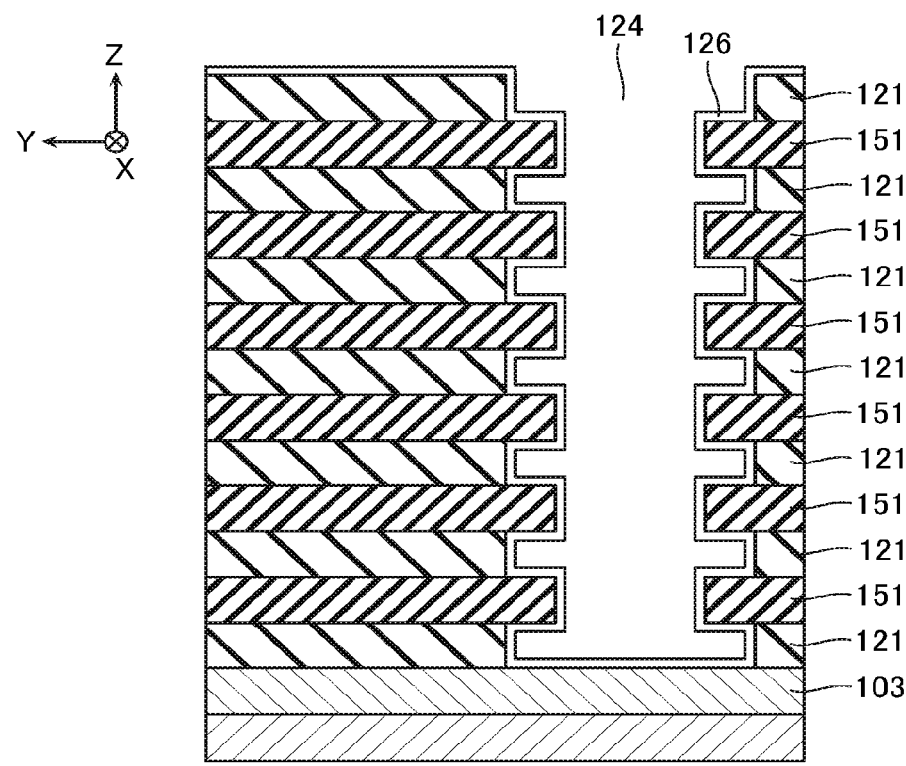

Next, as shown in FIG. 9, the memory layer 126 is deposited on a side surface of the inter-layer insulating layer 121 and on a bottom surface, side surface, and upper surface of the sacrifice layer 151, exposed on the side surface of the hole 124. When the memory layer 126 is deposited, the block layer 133, the charge accumulation layer 132, and the tunnel layer 131 are sequentially deposited. When the tunnel layer 131 is deposited, the oxide layer 143, the nitride layer 142, and the oxide layer 141 are sequentially deposited. Now, the oxide layers 141 and 143 of the tunnel layer 131 are formed by silicon oxide ($SiO_2$), for example. The nitride layer 142 of the tunnel layer 131 is formed by silicon nitride (SiN), for example. The charge accumulation layer 132 is formed by silicon nitride (SiN), for example. The block layer 133 is formed by silicon oxide ($SiO_2$), for example. Note that when the memory layer 126 is deposited, the memory layer 126 ends up being deposited also on an upper surface of the metal layer 103 exposed on a bottom surface of the hole 124, and on an upper surface of the uppermost layer inter-layer insulating layer 121.

Figure 10:
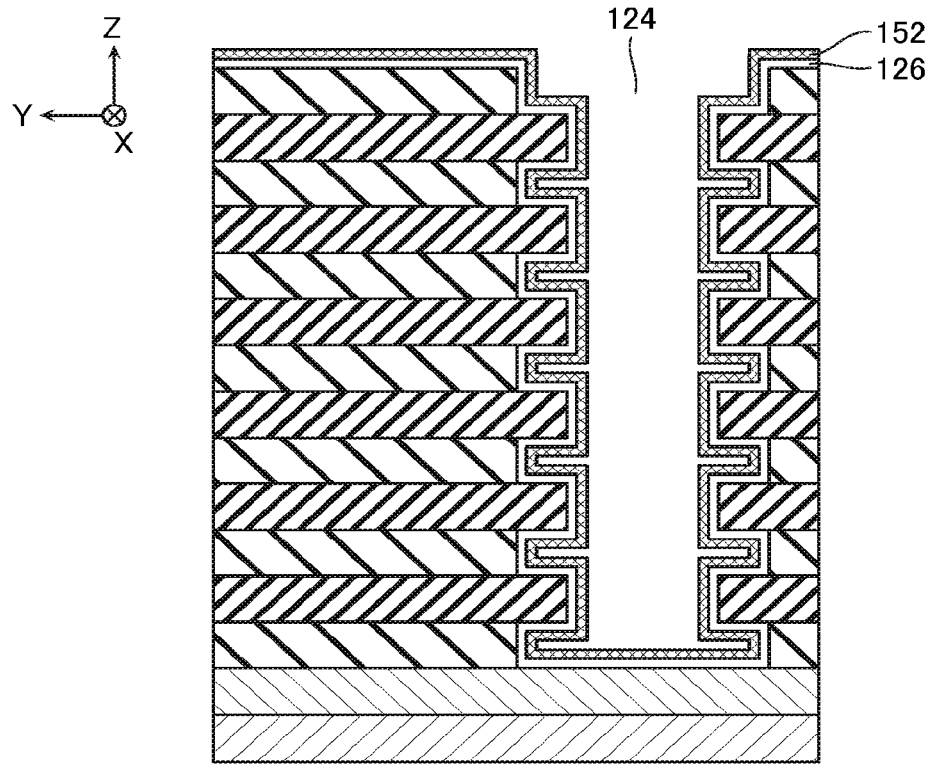

Next, as shown in FIG. 10, an etching cover layer 152 is deposited on a surface of the memory layer 126. Now, the etching cover layer 152 is a layer that reduces damage caused to the memory layer 126 when the memory layer 126 in a bottom part of the hole 124 is removed in a later step. The etching cover layer 152 is configured from a material for which an etching selection ratio can be taken with respect to the tunnel layer 131. For example, the etching cover layer 152 is formed by amorphous silicon (a-Si).

Figure 11:
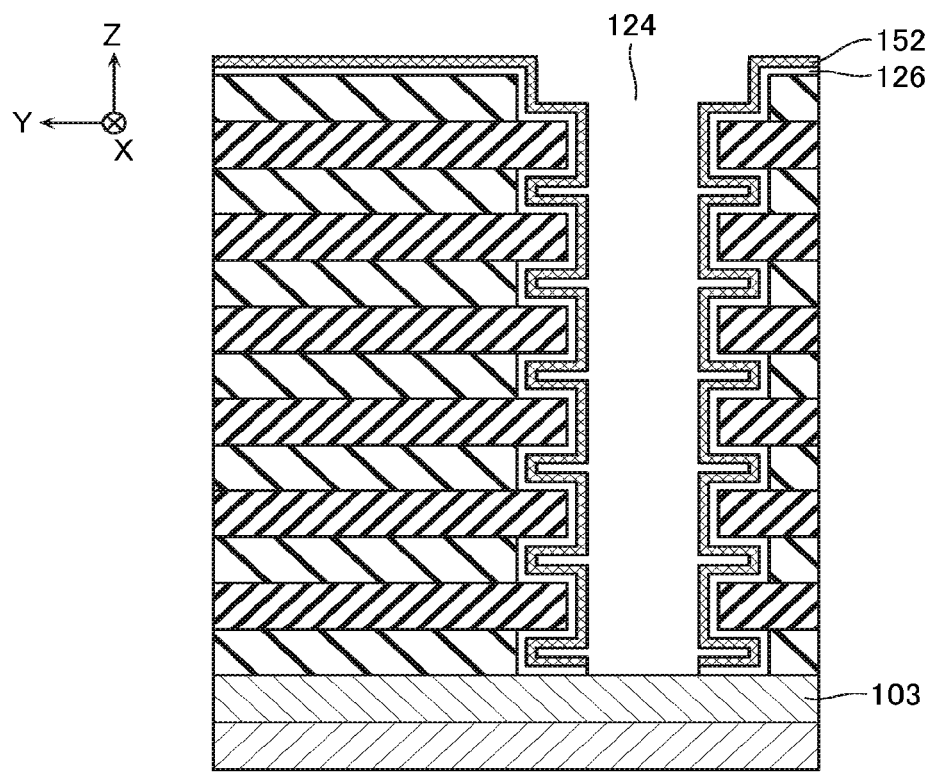

Next, as shown in FIG. 11, the etching cover layer 152 and the memory layer 126 in the bottom part of the memory hole 124 are removed by anisotropic etching, until the upper surface of the metal layer 103 is exposed.

Figure 12:
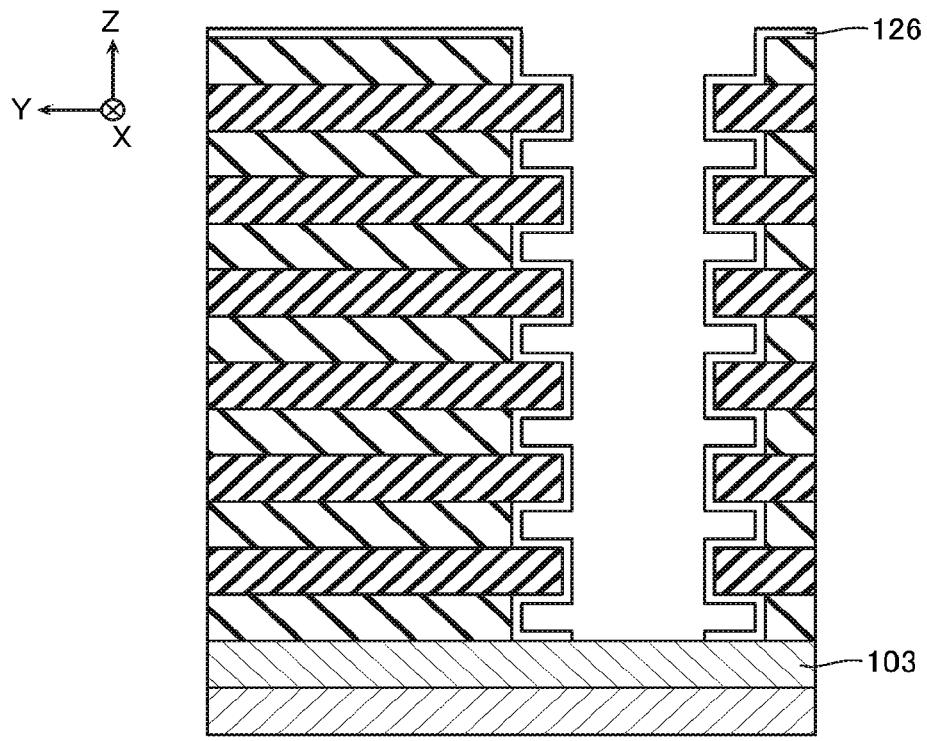

Next, as shown in FIG. 12, the etching cover layer 152 is removed by isotropic wet etching. A chemical solution of the kind where a selection ratio can be taken between the tunnel layer 131 and the etching cover layer 152, may be employed in the wet etching. For example, when the tunnel layer 131 is formed by silicon oxide ($SiO_2$) and the etching cover layer 152 is formed by amorphous silicon (a-Si), an alkaline chemical solution such as tetra methyl ammonium hydroxide ($C_4H_{13}NO$, TMAH) may be employed.

Figure 13:
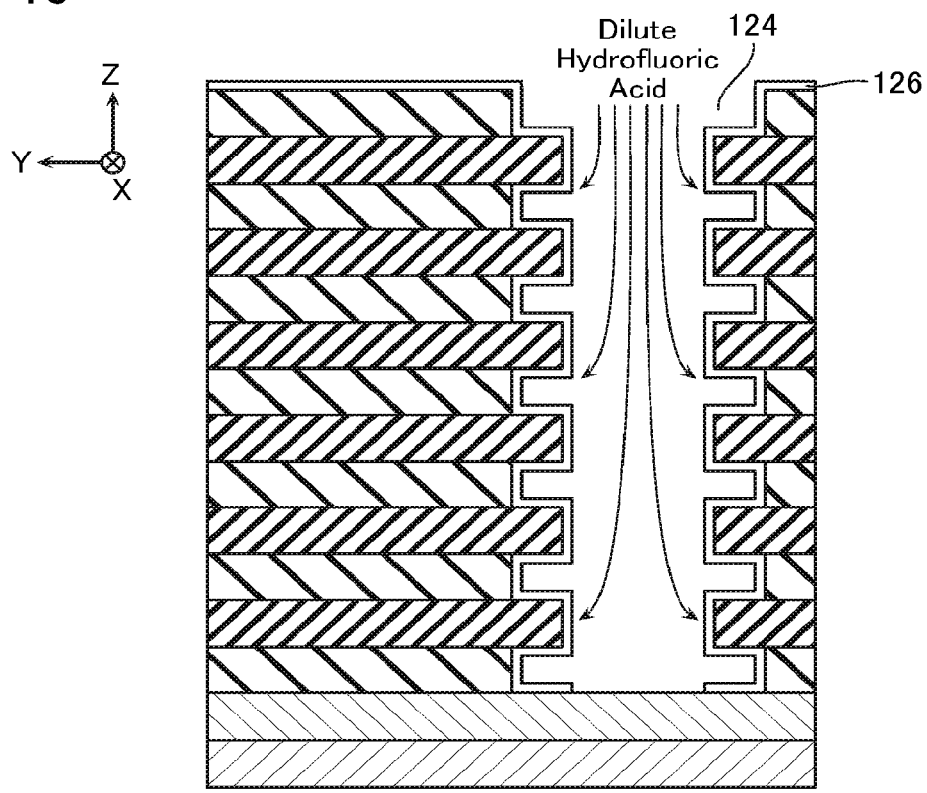

Note that the etching cover layer 152 need not necessarily be deposited. For example, after the memory layer 126 in the bottom part of the hole 124 has been removed, damage of the memory layer 126 can be remedied also by cleaning a surface of the memory layer 126 (tunnel layer 131 or oxide layer 141) by dilute hydrofluoric acid (HF), as shown in FIG. 13.

Figure 14:
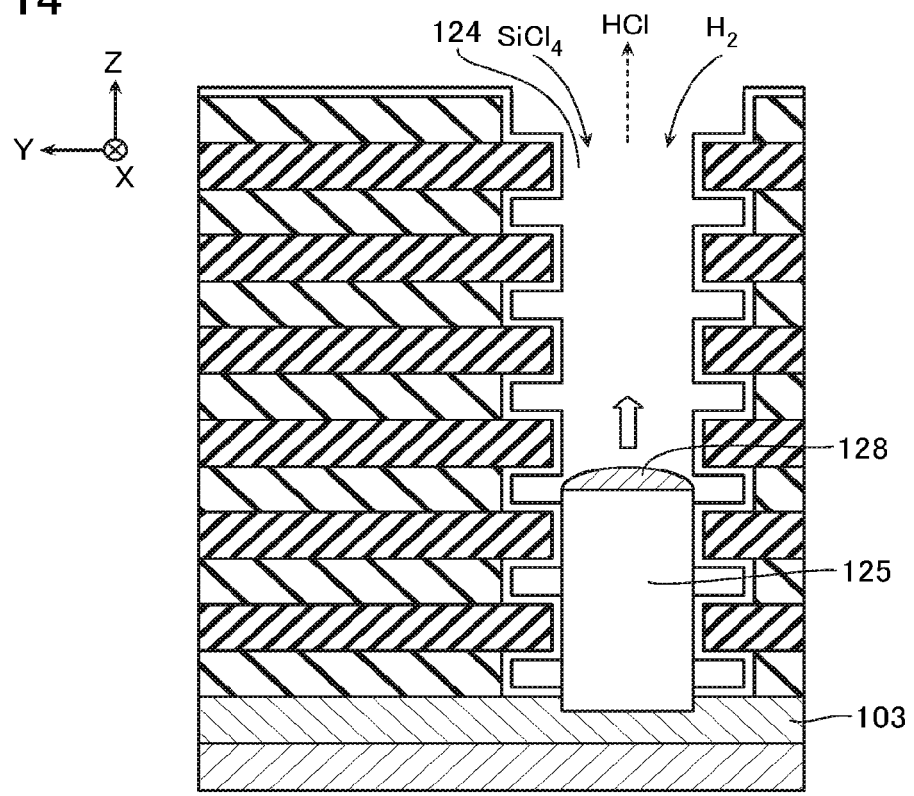

Next, as shown in FIG. 14, the semiconductor layer 125 is grown in the hole 124 by a VLS method using the metal layer 103 as a catalyst. Now, when, for example, the metal layer 103 is of aluminum (Al), gases of silicon tetrachloride ($SiCl_4$) and hydrogen ($H_2$) are caused to flow in the hole 124, and these gases are reacted with the metal layer 103 exposed on a bottom surface of the hole 124. As a result, a gas of hydrogen chloride (HCl) is generated, and silicon (Si) dissolves as a solid in the aluminum (Al). As a result, the semiconductor layer 125 configured from silicon (Si) grows as shown by the outline arrow in FIG. 14. Note that a layer 128 covering an upper surface of the semiconductor layer 125 during growth is the VLS catalyst by which the silicon (Si) has dissolved as a solid in the aluminum (Al).

Figure 15:
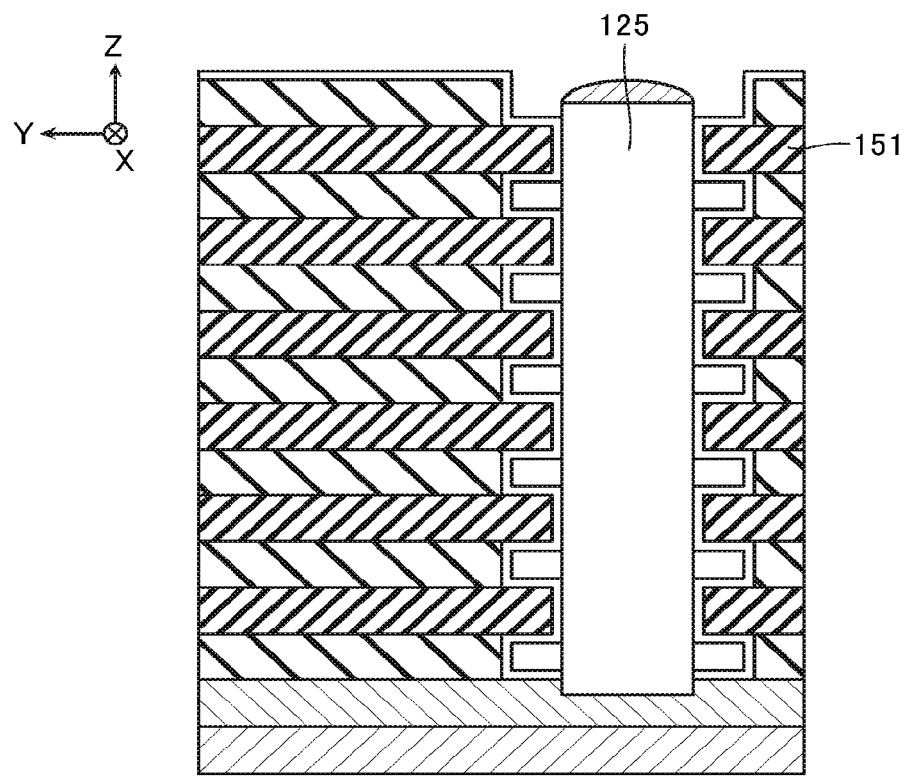

Moreover, as shown in FIG. 15, the semiconductor layer 125 is grown by the VLS method until its upper surface is at a position of at least an upper surface of the uppermost layer sacrifice layer 151.

Figure 16:
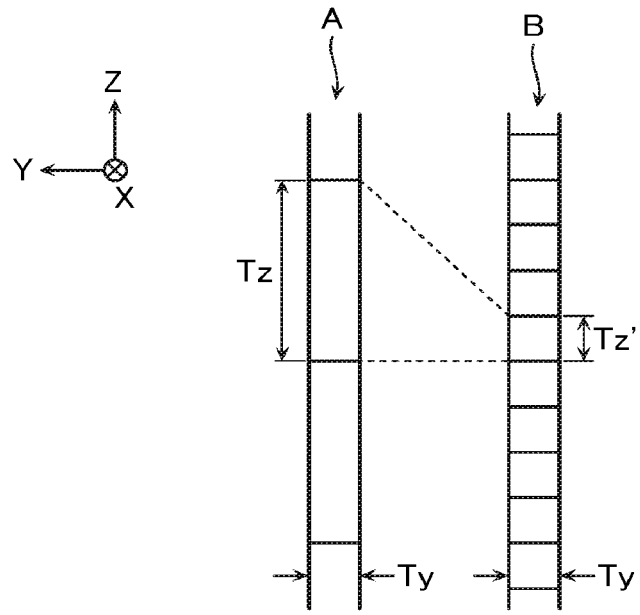

Note that, as shown in B in FIG. 16, when the semiconductor layer 125 has been formed by polysilicon (Poly-Si) generated by performing annealing processing of amorphous silicon (a-Si), a crystal of the semiconductor layer 125 only has an average grain size of about a layer thickness (width Ty in the Y direction).

In contrast, in the case of employing the above-described VLS method, the semiconductor layer 125 can be formed by monocrystalline silicon (Mono-Si), or by polysilicon (Poly-Si) having a crystal of large grain size. The large grain size mentioned here means the average grain size being sufficiently larger than the layer thickness (width Ty in the Y direction) as shown in A in FIG. 16, and, for example, refers to the average grain size being about five times the layer thickness. In this case, when the VLS method is employed, a length Tz in the Z direction of each crystal becomes longer than a length Tz' of each crystal of polysilicon (Poly-Si) due to annealing processing. In other words, employing the VLS method makes it possible to reduce a grain boundary which is a cause of electron scattering, with respect to a direction in which a cell current flows (Z direction). In other words, the VLS method makes it possible to deposit a semiconductor layer 125 in which the cell current flows more easily than in the case of it being due to annealing processing.

Figure 17:
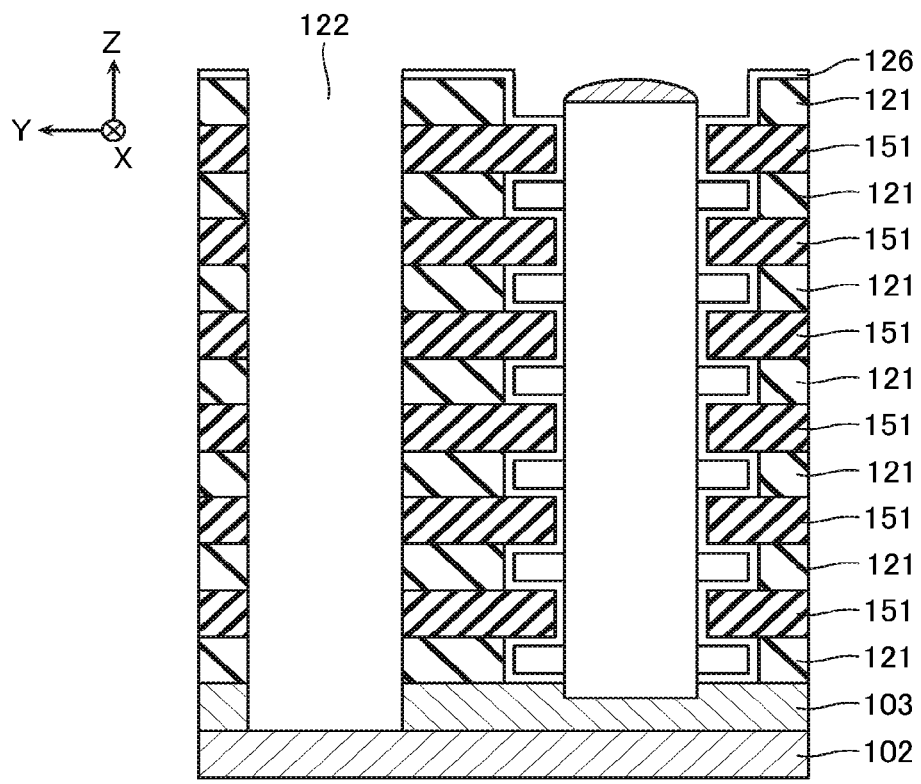

Next, as shown in FIG. 17, the trench 122 having the Z direction as its depth direction and having the X direction as its extension direction is formed in the memory layer 126, the plurality of inter-layer insulating layers 121, the plurality of sacrifice layers 151, and the metal layer 103. An upper surface of the conductive layer 102 is exposed in a bottom part of this trench 122.

Figure 18:
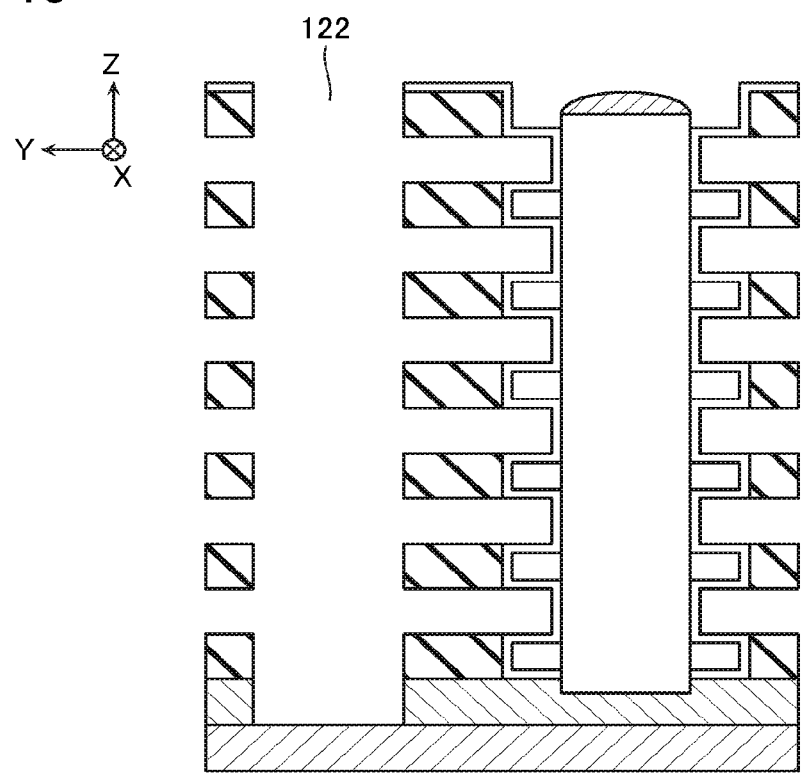

Next, as shown in FIG. 18, the sacrifice layer 151 is removed by wet etching via the trench 122.

Figure 19:
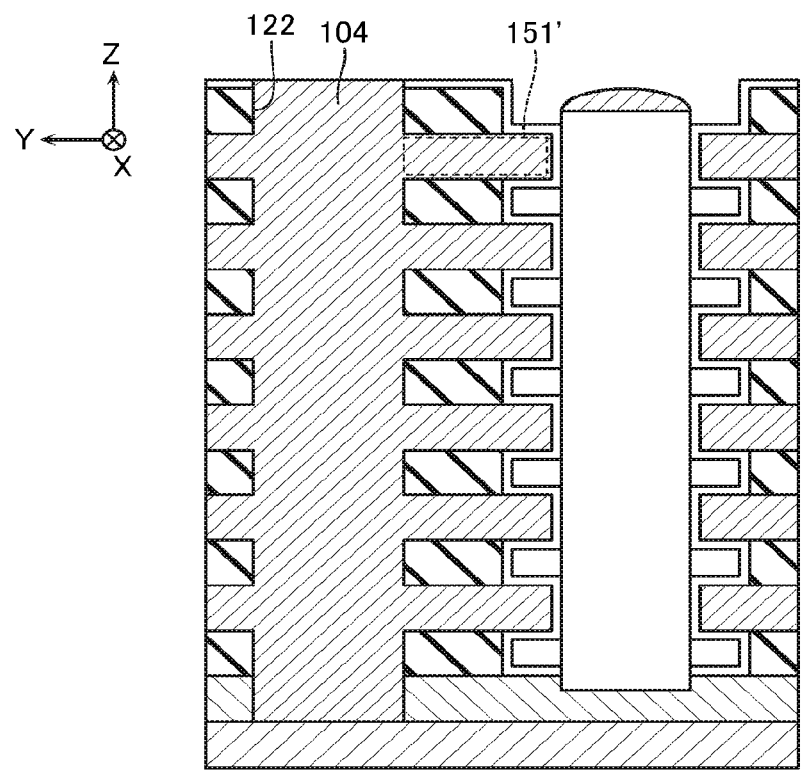

Next, as shown in FIG. 19, a place 151' where the sacrifice layer 151 was removed in the previous step is filled with the conductive layer 104, via the trench 122. Now, the conductive layer 104 is formed by tungsten (W), for example. Note that when the conductive layer 104 is filled into the place 151', the conductive layer 104 is sometimes also deposited also in the trench 122.

Figure 20:
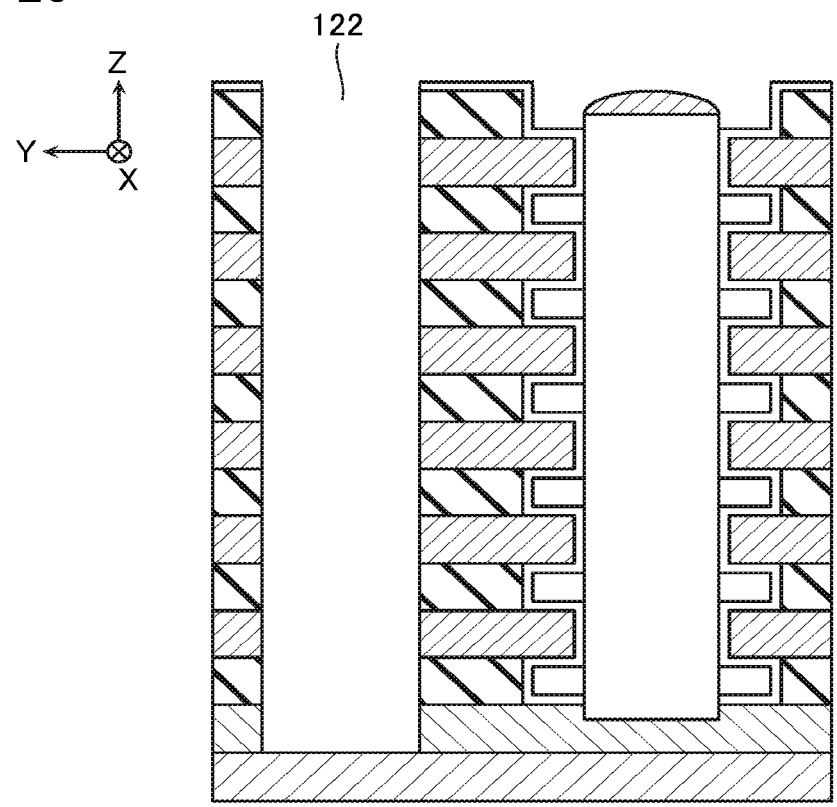

Next, as shown in FIG. 20, the excess conductive layer 104 in the trench 122 is removed by anisotropic etching.

Next, the insulating layer 123 is deposited on a side surface of the trench 122. At this time, when the insulating layer 123 is deposited also in the bottom part of the trench 122, part of the insulating layer 123 in this bottom part is removed. Now, the insulating layer 123 is formed by silicon oxide ($SiO_2$), for example. Finally, the conductive layer 108 is deposited in the trench 122 where the insulating layer 123 has been deposited. Now, the conductive layer 108 is formed by tungsten (W), for example.

As a result of the above steps, the memory cell array 1 shown in FIG. 4 is formed.

Next, advantages of the embodiment will be described using a comparative example.

Figure 21:
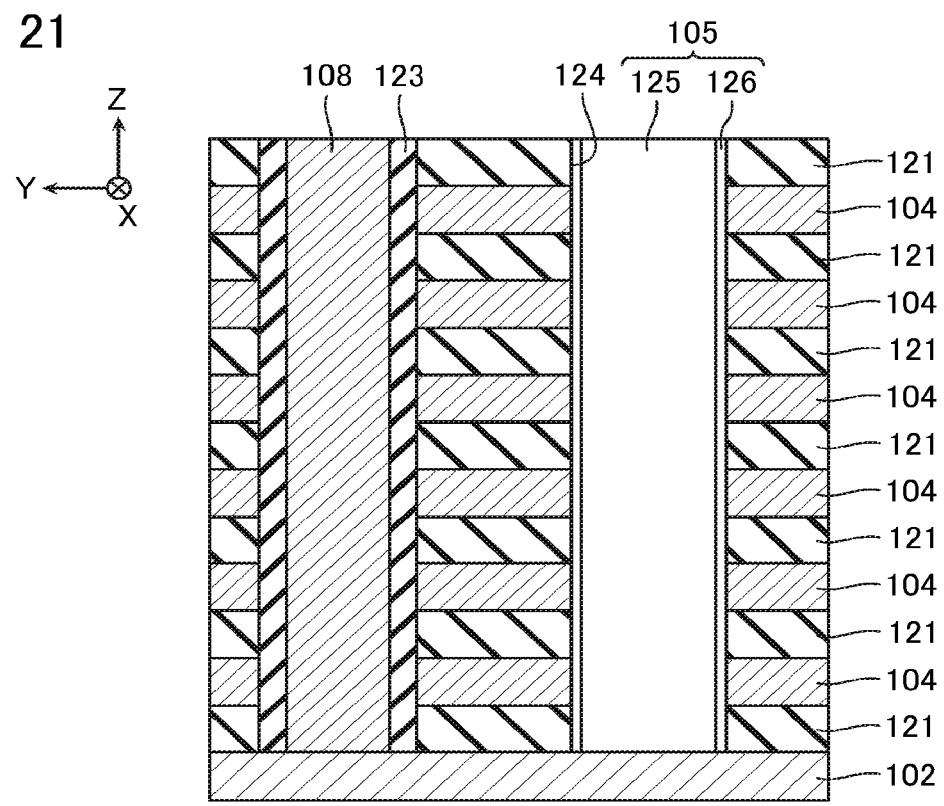
FIG. 21 is a cross view of a memory cell array of a semiconductor memory device according to a comparative example.

FIG. 21 is a cross-sectional view in the Y-Z directions of a memory cell array of a semiconductor memory device according to the comparative example. In FIG. 21, configurations corresponding to those of the memory cell array 1 of FIG. 4 are assigned with the same reference symbols as those assigned in FIG. 4.

Note that the memory cell array according to the comparative example has the following points of difference compared to the memory cell array 1 of the present embodiment. In other words, side surfaces facing the Y direction of the conductive layer 104 and the inter-layer insulating layer 121 are aligned, whereby the memory layer 126 following these side surfaces is formed linearly extending in the Z direction. Moreover, the semiconductor layer 125 and the memory layer 126 contact each other also in the same layer as the inter-layer insulating layer 121, similarly to in the same layer as the conductive layer 104.

In the case of the present embodiment, contrary to in the comparative example, in the same layer as the inter-layer insulating layer 121, the semiconductor layer 125 and the memory layer 126 have the gap provided between them, and are hardly in contact. Therefore, as a result of the present embodiment, disturbance resistance during the read operation can be improved, and margin in the write/erase operations can be improved, more than in the comparative example.

Moreover, in the case of the present embodiment, contrary to in the comparative example, the side surface of the inter-layer insulating layer 121 is more recessed than the side surface of the conductive layer 104. Therefore, in the case of the present embodiment, a length of the charge accumulation layer 126 formed between the memory cells MC adjacent in the Z direction, in other words, a path between the charge accumulation layers 126 of these memory cells MC, can be increased more than in the comparative example. As a result, the present embodiment leads to it being less easy for lateral leakage of charge between adjacent memory cells MC to occur, than in the comparative example.

Furthermore, when the semiconductor layer 125 is deposited by the VLS method as in the previously described manufacturing steps, the semiconductor layer 125 can be deposited by monocrystalline silicon (Mono-Si) or by polysilicon (Poly-Si) of large grain size, hence it becomes easier for the cell current to flow, and speeding up of the read operation is enabled.

In other words, the present embodiment makes it possible to provide a semiconductor memory device that achieves a margin increase in the write/erase operations, an improvement in data retaining characteristics, and speeding up of the read operation.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 22:
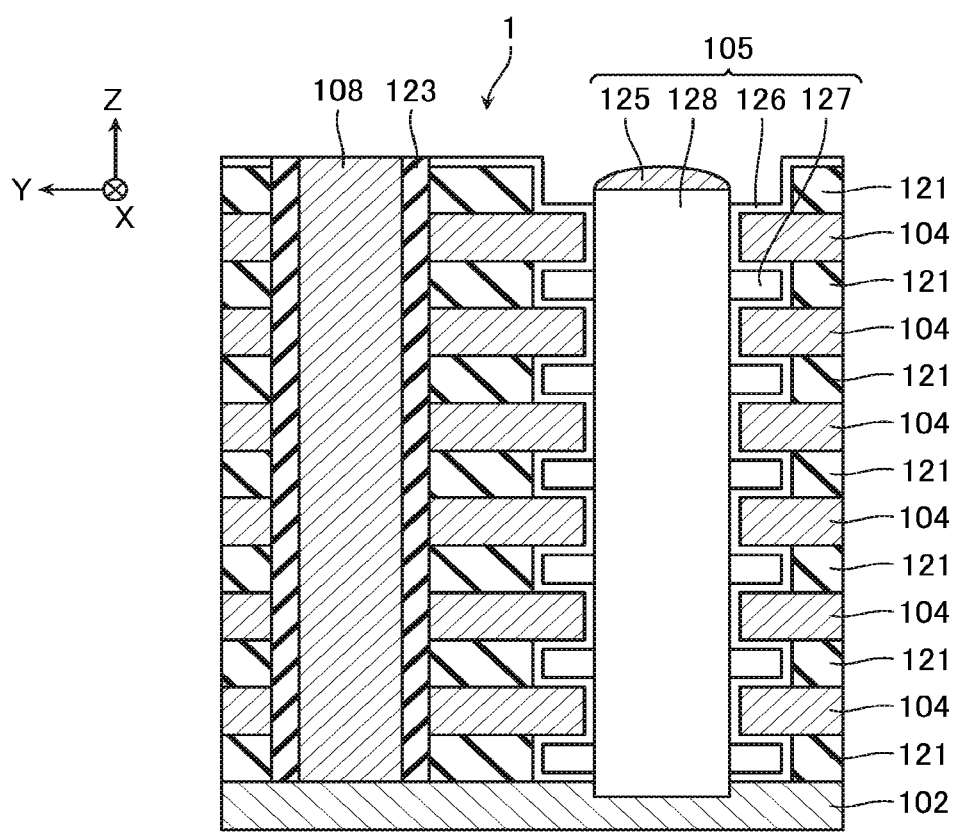
FIG. 22 is a cross-sectional view of another memory cell array of the semiconductor memory device according to the embodiment.

For example, the memory cell array 1 of the embodiment is not limited to the structure shown in FIG. 4. For example, when the conductive layer 102 is formed by a metal acting as a catalyst of VLS growth, such as aluminum (Al), tin (Sn), gold (Au), or the like, this conductive layer 102 itself can be utilized in the VLS growth, hence as shown in FIG. 22, it is also possible to omit a configuration corresponding to the metal layer 103 shown in FIG. 4.

What is claimed is:

1. A semiconductor memory device, comprising:
   a semiconductor substrate;
   a plurality of first insulating layers and first conductive layers stacked alternately in a first direction above the semiconductor substrate;
   a first semiconductor layer extending in the first direction; and
   a memory layer disposed between one of the first insulating layers and the first semiconductor layer and between one of the first conductive layers and the first semiconductor layer, the memory layer including a charge accumulation layer and a second insulating layer, the second insulating layer being between the charge accumulation layer and the first semiconductor layer,
   the first semiconductor layer and the memory layer having a gap in which the first semiconductor layer and the second insulating layer are exposed, between one of the first insulating layers and the first semiconductor layer, and
   the first semiconductor layer and the memory layer being contacted each other, between one of the first conductive layers and the first semiconductor layer.

2. The semiconductor memory device according to claim 1, wherein
   the memory layer includes the second insulating layer, the charge accumulation layer, and a third insulating layer that are disposed from the first semiconductor layer to the first conductive layer.

3. The semiconductor memory device according to claim 1, wherein
   the second insulating layer includes a first oxide layer, a nitride layer, and a second oxide layer that are disposed from the first semiconductor layer to the charge accumulation layer.

4. The semiconductor memory device according to claim 1, wherein
a length in a second direction intersecting the first direction of the first insulating layer is smaller than a length in the second direction of the first conductive layer.

5. The semiconductor memory device according to claim 1, wherein
the first semiconductor layer includes monocrystalline silicon or polysilicon having a crystal whose average grain size is larger than its average width in the second direction.

6. The semiconductor memory device according to claim 1, further comprising
a second conductive layer disposed between the semiconductor substrate and the lowermost layer among the first insulating layers.

7. The semiconductor memory device according to claim 6, further comprising
a first metal layer disposed between the second conductive layer and the lowermost layer among the first insulating layers.

8. The semiconductor memory device according to claim 7, wherein
the first metal layer includes at least one selected from the group consisting of aluminum (Al), tin (Sn), and gold (Au).

9. The semiconductor memory device according to claim 7, wherein
a bottom surface of the first semiconductor layer contacts an upper surface of the first metal layer.

10. The semiconductor memory device according to claim 1, wherein
the memory layer is disposed continuously along a side surface and upper surface of one of the first conductive layers, a side surface of one of the first insulating layers disposed above the first conductive layer, and a bottom surface and side surface of another of the first conductive layers disposed above the first insulating layer.

11. A semiconductor memory device, comprising:
a semiconductor substrate;
a plurality of first insulating layers and first conductive layers stacked alternately in a first direction above the semiconductor substrate;
a first semiconductor layer extending in the first direction; and
a memory layer disposed between one of the first insulating layers and the first semiconductor layer and between one of the first conductive layers and the first semiconductor layer, the memory layer including a charge accumulation layer,
the first semiconductor layer and the memory layer having a gap, between all of the first insulating layers and the first semiconductor layer, and
the first semiconductor layer and the memory layer being contacted each other, between one of the first conductive layers and the first semiconductor layer.

12. The semiconductor memory device according to claim 11, wherein
the memory layer includes a second insulating layer, the charge accumulation layer, and a third insulating layer that are disposed from the first semiconductor layer to the first conductive layer.

13. The semiconductor memory device according to claim 12, wherein
the second insulating layer includes a first oxide layer, a nitride layer, and a second oxide layer that are disposed from the first semiconductor layer to the charge accumulation layer.

14. The semiconductor memory device according to claim 11, wherein
a length in a second direction intersecting the first direction of one of the first insulating layers is smaller than a length in the second direction of the first conductive layer.

15. The semiconductor memory device according to claim 11, wherein
the first semiconductor layer includes monocrystalline silicon or polysilicon having a crystal whose average grain size is larger than its average width in the second direction.

16. The semiconductor memory device according to claim 11, further comprising
a second conductive layer disposed between the semiconductor substrate and the lowermost layer among the first insulating layers.

17. The semiconductor memory device according to claim 16, further comprising
a first metal layer disposed between the second conductive layer and the lowermost layer among the first insulating layers.

18. The semiconductor memory device according to claim 17, wherein
the first metal layer includes at least one selected from the group consisting of aluminum (Al), tin (Sn), and gold (Au).

19. The semiconductor memory device according to claim 17, wherein
a bottom surface of the first semiconductor layer contacts an upper surface of the first metal layer.

20. The semiconductor memory device according to claim 11, wherein
the memory layer is disposed continuously along a side surface and upper surface of one of the first conductive layers, a side surface of one of the first insulating layers disposed above the first conductive layer, and a bottom surface and side surface of another of the first conductive layers disposed above one of the first insulating layers.

* * * * *